SEMICONDUCTOR DEVICE UTILIZING AN $AuAl_2$ LAYER AS A DIFFUSION BARRIER THAT PREVENTS "PURPLE PLAGUE"

Filed Oct. 12, 1965

INVENTORS
SHIGEZO TANAKA
KOZO CHIBA
BY
Hopgood & Calimafde
ATTORNEYS.

3,401,316

SEMICONDUCTOR DEVICE UTILIZING AN $AuAl_2$ LAYER AS A DIFFUSION BARRIER THAT PREVENTS "PURPLE PLAGUE"

Shigezo Tanaka and Kozo Chiba, Tokyo, Japan, assignors to Nippon Electric Company Limited, Tokyo, Japan, a corporation of Japan Filed Oct. 12, 1965, Ser. No. 495,083
Claims priority, application Japan, Oct. 12, 1964, 39/58,101
3 Claims. (Cl. 317—235)

This invention relates to a semiconductor device utilizing an $AuAl_2$ layer between the substrate and a lead wire connected thereto.

It has been the practice in attaching a lead wire to a mesa or planar type transistor to deposit an aluminum layer on the emitter and base region of the germanium or silicon substrate, and then to alloy the aluminum with the substrate, thereby forming an emitter electrode and base electrode. Following this, a gold wire is then thermocompression-bonded thereto. In such a structure, however, a purple compound, $AuAl_2$, is formed at the interface between the aluminum layer and gold wire, as a result of mutual diffusion of gold and aluminum. This occurs because of diffusion of aluminum into gold wire and that of gold into aluminum layer, since the element is maintained at an elevated temperature of 150 to 300° C. for a long period of time after encapsulation during stabilization at an elevated temperature, or during operational aging, or during actual operation. When an aluminum layer is deposited and alloyed so as to reduce the contact resistance between the aluminum and silicon, an aluminum-silicon eutectic alloy containing 13% silicon is formed. A gold wire thermocompression-bonded to the aluminum results in the formation of a black aluminum-silicon-gold alloy when the assembly is held at an elevated temperature for a long period of time. The interface between the eutectic alloy and gold wire becomes extremely brittle and the mechanical strength of the bond is adversely affected.

One method proposed to inhibit or prevent the formation of such a black alloy of aluminum-silicon-gold during elevated temperature storage or operation is to ultrasonically bond aluminum wire instead of gold wire. The bonding of an aluminum wire to an aluminum layer is technically more difficult than a gold wire to an aluminum layer, and the compression-bonded portion is weaker in the former than the latter. Moreover, the purple compound $AuAl_2$ grows at the interface between the aluminum wire and lead post, if a gold plated header is used, thus deteriorating the mechanical strength of the bond.

Another method proposed as a preventive is to deposit a silver layer on the aluminum layer, a gold wire being compression-bonded thereto so as to prevent direct contact of aluminum to gold. The bonding force between silver and aluminum, however, is not as strong as between gold and aluminum, and silver is poor in anticorrosiveness and forms dendritic crystal if operated at an elevated temperature, possibly shorting the emitter and the base.

Another method proposed as a preventive is to deposit a chromium layer on the silicon surface instead of an aluminum layer, a gold wire being then thermocompression-bonded thereto. Since compression bonding generally gives excellent results between metals having extremely strong bonding force therebetween, however, chromium is inferior to silicon or aluminum in its bonding force therewith. On the other hand, if the bonding force is so strong as between gold and aluminum, mutual diffusion takes place at the interface of the two metals during elevated temperature storage or operation and a brittle compound is formed; for example, in the presence of silicon in aluminum, a black brittle aluminum-silicon-gold alloy is formed which adversely affects the reliability of the bonding of gold wire to aluminum.

The present invention eliminates such defects as described above by positively making use of $AuAl_2$ which is stable and has been the cause of defects. The present invention provides a semiconductor device in which diffusion of aluminum and silicon into the gold wire and that of gold into the aluminum-silicon is inhibited so as to maintain it as originally thermocompression-bonded, even after elevated temperature storage or operation, thus eliminating the unstableness of the bond between the gold wire and electrode while providing thermal stability.

As illustrative of the various embodiments provided by the invention, reference is made to the following disclosure and the accompanying drawing; wherein.

Figure 1:
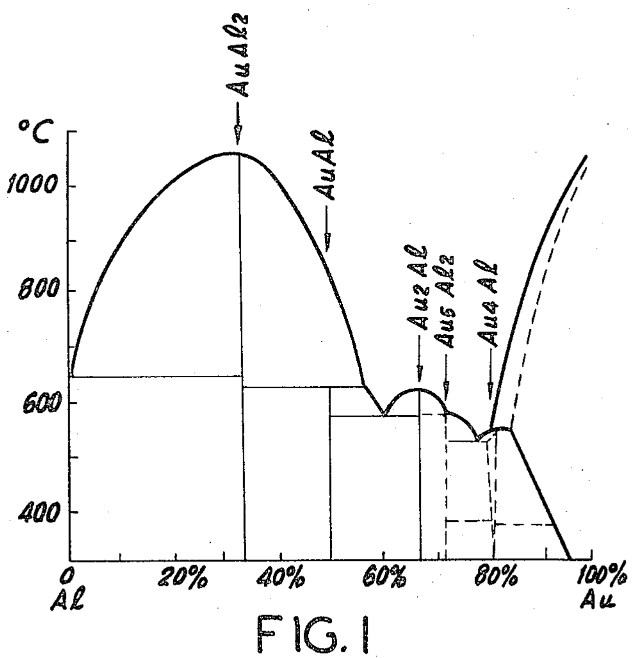
FIG. 1 is a phase diagram of the binary system gold and aluminum.

The present invention makes use of the thermal stability of $AuAl_2$. As shown in the phase diagram of gold-aluminum of FIG. 1, five different compounds exist in the gold-aluminum binary system of which $AuAl_2$ has the lowest free energy of formation, that is to say, $AuAl_2$ is the most stable compound thereof. Therefore, if only $AuAl_2$ is formed, excess gold, aluminum or silicon is unable to diffuse into $AuAl_2$ and conversely gold or aluminum in $AuAl_2$ is unable to diffuse outward therefrom into the gold wire or aluminum-silicon layer. In effect, $AuAl_2$ behaves as a diffusion barrier layer.

The present invention further utilized the physical properties of $AuAl_2$ which do not contradict those required for the electrode material. $AuAl_2$ has a face centered cubic lattice structure with lattice constant of 5.9747 A.; it has an electric conductivity of a layer of 1 micron thick is 20 $\mu$ohm-cm. at room temperature; and its thermal conductivity is 0.30 cal./sec.–cm.–deg. at room temperature. Its electric and thermal conductivities are not as high as gold or aluminum but the difference is negligible when the layer is thin. Thermal expansion coefficients of $AuAl_2$, 13% silicon-aluminum, and silicon are $1.1\times10^{-5}$/° C., $2.0\times10^{-5}$/° C., and $0.42\times10^{-5}$/° C., respectively, at room temperature. Accordingly, the residual stress due to the difference in thermal expansion coefficients on the substrate silicon when $AuAl_2$ is bonded thereto is far less than when 13% silicon-aluminum is bonded thereto, and hence $AuAl_2$ gives less influence to the p–n junction. The thermal expansion for germanium is about $0.58\times10^{-5}$/° C.

Figure 2:
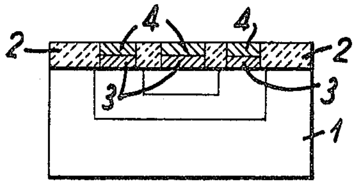
FIGS. 2 to 5 show in cross section the various embodiments of a semiconductor utilizing the inventive concept.
Figure 3:
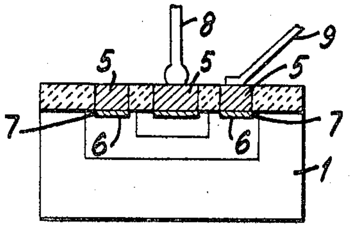

The present invention will now be described in more detail referring to the embodiments illustrated in the drawing. In FIG. 2 a silicon n-p-n planar type element 1 has silicon oxide film 2 covering emitter-base and base-collector junctions extending to the surface and having a dual layer of aluminum and gold deposited on the emitter and base regions, the aluminum film 3 being deposited on the emitter and base regions, and the gold film 4 being deposited on the aluminum-deposited film. The ratio of the thickness of the dual aluminum and gold films is 2:1 so that $AuAl_2$ is formed in chemical equivalent. The element is then heated at, for example, 500° C. for one hour in a reducing or inactive atmosphere. Since the diffusion of aluminum into gold, and gold into aluminum is much faster than the diffusion of aluminum into silicon, or silicon into aluminum, the majority of aluminum forms $AuAl_2$ with the gold film before aluminum and silicon form their alloy and a part of aluminum forms the interface 6 and aluminum-silicon layer 7 of eutectic composition as shown in FIG. 3 due to mutual diffusion. As a matter of course the depth of the interface 6 formed by the mutual diffusion of aluminum and silicon is shallow, hence the residual stress in the substrate silicon due to the difference in the thermal expansion coefficients is reduced, and this in turn reduces the possibility of cracks in the vicinity of the p-n junction, as is well known. It is desirable to deposit more aluminum than in the ratio of 2:1 in chemical equivalent taking into account the amount of aluminum which diffuses mutually with silicon. A fine gold wire is then nailhead-bonded as indicated by the numeral 8 or wedge-bonded as shown by the numeral 9 on the $AuAl_2$ film 5. The device thus formed was stored at 300° C. for 20 hours after encapsulation and the bonded portion was examined, but no change was observed. A device having a gold wire thermocompression-bonded on aluminum was also stored under the same condition, and it was noted that the black aluminum-silicon-gold alloy had spread widely on the aluminum film adjacent the bonded portion.

The same effect can be expected in the p-n-p planar type, p-n-p or n-p-n mesa type germanium, silicon transistor or other Group III to V semiconductor material or compound semiconductor device.

Figure 4:
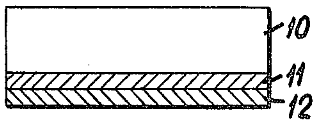
Figure 5:
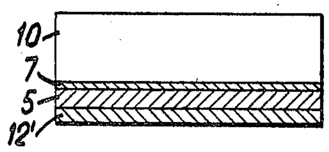

As another example, FIG. 4 shows a p-n junction element 10 to be ohmic contacted to a header. Aluminum 11 is deposited on the face of a p-type region and then gold 12 is deposited thereupon, wherein the rato of gold and aluminum film thickness is made higher than 1:2, for example 1.5:2. The element is then heated at, for example, 600° C., for 30 minutes in air, resulting in an aluminum-silicon alloy layer 7 due to the mutual diffusion of a part of aluminum and silicon as shown in FIG. 5 and the majority of aluminum forms with gold $AuAl_2$ compound layer 5 which has the lower free energy of formation. The amount of deposited gold is much more than half the sum of aluminum by atomic number forming the silicon-aluminum alloy layer and $AuAl_2$ compound, a gold layer 12' being partly left on the outer surface of $AuAl_2$, thus enabling contact to the header by means of gold solder, silver solder, lead-tin solder or the like.

The present invention may also be applied to the aluminum layer on silicon oxide. For example in the expanded electrode on silicon oxide from the emitter, base or other active or inactive regions of a silicon epitaxial planar transistor or silicon integrated circuit, or a capacitor using silicon oxide film, aluminum depoisted thereon reduces a part of the silicon oxide film while heated at 700° C. for 1 hour in a reducing or inactive atmosphere forming aluminum oxide as well as aluminum-silicon alloy layer fixed to the silicon oxide film layer. Gold is so deposited on the aluminum layer that the ratio by atomic number is 2:1 between aluminum and gold, and heated at for example 600° C. for 30 minutes. The residual aluminum then forms $AuAl_2$ with gold. Since $AuAl_2$ film is extremely stable, gold or aluminum does not dissociate therefrom to form ternary alloy, even if gold, silver or tin is deposited or plated on the $AuAl_2$ layer in order to enable easier soldering, and the element is further heated in order to form better ohmic contact. Therefore good ohmic contact can be obtained using $AuAl_2$ film.

Although the present invention has been described in reference to specific embodiments of silicon, junction device, the similar effect may be expected in making ohmic contact between a material containing silicon as the main constituent such as glass plate, silicon carbide, quartz, or crystallized quartz, and metal. Therefore, it will be appreciated that variations of the present invention will be apparent to those skilled in the art and that the present invention will be limited only by the spirit and the scope of the appended claims.

We claim:

1. A semiconductor device comprising a semiconductor substrate selected from the group consisting of germanium and silicon, a layer of $AuAl_2$ bonded to the surface of said substrate and a fine gold electrode wire bonded to said layer of $AuAl_2$, said $AuAl_2$ layer serving as a diffusion barrier between the substrate, aluminum and said bonded gold wire.

2. The semiconductor of claim 1, wherein the substrate is silicon.

3. The device of claim 2 wherein the silicon substrate comprises an emitter and a base region to which said layer of $AuAl_2$ is bonded.

References Cited

UNITED STATES PATENTS

| | | | |
|---|---|---|---|
| 3,190,954 | 6/1965 | Pomerantz | 174—94 |
| 3,202,489 | 8/1965 | Bender et al. | 29—195 |
| 3,271,635 | 9/1966 | Wagner | 317—195 |

JOHN W. HUCKERT, *Primary Examiner.*

M. EDLOW, *Assistant Examiner.*